US012808953B2

(12) United States Patent
Houis et al.

(10) Patent No.: US 12,808,953 B2
(45) Date of Patent: Nov. 24, 2026

(54) SENSOR DEVICE FOR SAFETY CRITICAL APPLICATIONS

(71) Applicant: Melexis Technologies SA, Bevaix (CH)

(72) Inventors: Simon Houis, Bevaix (CH); Bruno Boury, Tessenderlo (BE); Paul Laval, Grasse (FR); Guido Dupont, Bevaix (CH); Lionel Tombez, Bevaix (CH)

(73) Assignee: MELEXIS TECHNOLOGIES SA, Bevaix (CH)

( * ) Notice: Subject to any disclaimer, the term of this patent is extended or adjusted under 35 U.S.C. 154(b) by 146 days.

(21) Appl. No.: 18/987,273

(22) Filed: Dec. 19, 2024

(65) Prior Publication Data

US 2025/0216480 A1 Jul. 3, 2025

(30) Foreign Application Priority Data

Dec. 27, 2023 (EP) .................................... 23220299

(51) Int. Cl.
*G01R 33/00* (2006.01)

(52) U.S. Cl.
CPC ..... *G01R 33/0035* (2013.01); *G01R 33/0029* (2013.01)

(58) Field of Classification Search
CPC .. G01R 33/0035; G01R 33/0029; G01D 3/08; G01D 5/00; G01D 5/12
See application file for complete search history.

(56) References Cited

U.S. PATENT DOCUMENTS

| | | | | |
|---|---|---|---|---|
| 2005/0038623 | A1 | 2/2005 | Hammerschmidt | |
| 2018/0203059 | A1 * | 7/2018 | Sacco ................ | G01R 31/2829 |
| 2019/0391212 | A1 | 12/2019 | Rubinsztain et al. | |
| 2022/0196739 | A1 * | 6/2022 | Rubinsztain ....... | G01R 31/2829 |
| 2022/0337263 | A1 | 10/2022 | Vergauwen | |

OTHER PUBLICATIONS

Extended European Search Report from Corresponding European Patent Application No. EP23220299.4, Jun. 5, 2024.

* cited by examiner

*Primary Examiner* — Dominic E Hawkins
(74) *Attorney, Agent, or Firm* — Workman Nydegger

(57) ABSTRACT

The present invention relates to a sensor system for safety-critical applications comprising at least one sensor device, which includes a sensor for measuring a physical parameter and generating a corresponding signal, a signal processing chain for processing this signal, and an interface for handling an external synchronization signal. The device also features a transient signal generator that produces a transient and a coupling element for introducing the transient signal into the signal processing chain's input such that the transient signal which is coupled to the signal processing chain has a predetermined relation with the synchronization signal. This configuration allows for the detection of errors within the sensor device and/or calibration of the sensor system by measuring the time difference between the synchronization signal and the detection moment of the transient signal.

13 Claims, 11 Drawing Sheets

SENSOR DEVICE FOR SAFETY CRITICAL APPLICATIONS

FIELD OF THE INVENTION

The present invention relates to the field of sensor devices. More specifically it relates to the field of sensor devices with built-in diagnostic capabilities.

BACKGROUND OF THE INVENTION

The field of sensor devices (e.g. integrated sensor circuits) is a rapidly evolving area of technology that plays a critical role in a wide range of applications, from automotive and industrial systems to consumer electronics and medical devices. These circuits are designed to measure physical parameters such as temperature, pressure, magnetic fields, and acceleration, and convert them into electrical signals that can be processed and interpreted by electronic control units (ECUs).

One of the challenges in this field is ensuring the reliability of the sensor device especially in safety-critical applications where accurate and timely data is essential. For instance, in automotive systems, sensors must provide precise measurements to ensure the proper functioning of safety features like battery monitoring and motor control, anti-lock braking systems, airbags, and stability control. Similarly, in industrial automation, sensors need to operate reliably in harsh environments and provide accurate data for process control.

A significant problem that arises in the context of integrated sensor circuits is the need for effective diagnostic capabilities. High-speed sensor systems, which are increasingly common in various applications, require fast and on-demand diagnostics that have minimal impact on the main sensing function. The ability to quickly diagnose and address issues within the sensor system is crucial to maintaining the overall performance and safety of the system.

In high-speed systems, the time available to perform diagnostics is limited, and traditional methods may not be suitable. Moreover, the diagnostic process itself should not interfere with the sensor's primary function of accurately measuring physical parameters. This necessitates a diagnostic approach that can be seamlessly integrated into the operation of the sensor system without causing significant downtime or disruption.

Furthermore, the complexity of modern sensor systems, which may include multiple sensing elements and signal processing chains, adds to the challenge of implementing effective diagnostics. Each component within the system must be tested to ensure it is functioning correctly, and any faults must be quickly identified and rectified.

Despite the advancements in sensor technology and diagnostic methods, there remains a need for further improvements in the field. These improvements should address the challenges of providing fast, reliable, and non-intrusive diagnostics for high-speed sensor systems, ensuring that they continue to operate effectively and safely in all conditions.

SUMMARY OF THE INVENTION

It is an object of embodiments of the present invention to enable fast runtime checks that cover the full signal path up to the electronic control unit without interrupting the normal operation of the sensor device. This objective is accomplished by a sensor device for safety critical applications according to the invention.

In a first aspect, the present invention relates to a sensor system for safety critical applications comprising at least one sensor device and an electronic control unit, the sensor device comprising: a sensor for measuring a physical parameter and obtaining a signal indicative of the physical parameter, a signal processing chain configured for processing and transmitting the sensor signal to obtain a processed signal at an output of the signal processing chain, an interface configured for receiving or transmitting a synchronization signal external to the sensor device, a transient signal generator configured for generating a transient signal and a coupling element configured for coupling the transient signal to the input of the signal processing chain to obtain a processed transient signal at the output of the signal processing chain, wherein the transient signal which is coupled to the signal processing chain has a predetermined time relation with the synchronization signal. In embodiments of the present invention the transient signal can be generated in response to the synchronization signal, or the transient signal can be coupled in response to the synchronization signal, or both the electronic control unit comprising:

- a signal acquisition module for receiving the processed signal from the output of the signal processing chain,
- a processing module configured for analyzing the processed signal and detecting the processed transient signal, which is present in the processed signal from the signal processing chain, for determining one or more errors in the sensor device, and/or for calibrating the sensor system based on a time difference between the synchronization signal and a detection moment of the processed transient signal.

Where in embodiments of the present invention reference is made to the processed transient signal, reference is made to the transient signal which is processed in the signal processing chain.

In embodiments of the present invention the processing module is configured for analyzing the processed signal and detecting at least one characteristic of the processed transient signal.

In embodiments of the present invention the sensor system is configured for obtaining an expected time difference and for measuring a real time difference between the synchronization signal and the detection moment of the processed the transient signal.

It is an advantage of embodiments of the present invention that time difference between the synchronization signal and the detection moment of the processed transient signal can be used for determining correct operation of the sensor device and/or for calibrating the sensor system. By calibrating the sensor system changes in delays between the synchronization signal and the detection moment of the processed transient signal can be compensated for, and correct operation of the sensor system can be maintained which is important for safety critical applications.

In embodiments of the present invention, an expected time difference can be used for determining at least one error and/or correct operation of the sensor device, and/or for calibration the sensor system. The expected time difference can be a predefined time difference stored in the processing module.

In embodiments of the present invention the output of the sensor is connectable with an input of the signal processing chain.

In embodiments, the coupling element may be configured for switching between the output of the sensor and an output of the transient signal generator. This embodiment provides the advantage of selectively testing the signal processing chain with either the sensor signal or the transient signal without interference. In embodiments, the coupling element may be configured for summing the sensor signal and the transient signal. This embodiment allows for simultaneous transmission of both signals, facilitating concurrent operation and testing.

In embodiments, the coupling element may be configured for adding the transient signal by biasing the sensing element in function of the transient signal. This embodiment enables the modification of the sensor's response to test its functionality under varied conditions.

In embodiments, the coupling element may be configured for modulating the physical parameter by superposing a signal which is derived from the transient signal. This embodiment allows for the assessment of the sensor's behavior under simulated variations of the physical parameter.

In embodiments, the sensor may be a magnetic sensor. This embodiment specifies the type of sensor, which is particularly relevant for applications involving magnetic field measurements.

In embodiments, the coupling element may be a current conductor or a coil arranged for generating a superposition magnetic field at a location of the sensor. This embodiment provides the advantage of enabling the testing of magnetic sensors by creating a controlled magnetic field. It is clear from these examples that in some embodiments, it is not the transient signal itself that is coupled to the input of the signal processing chain but a processed version thereof and/or a combination with another signal (e.g. when the bias current or a coil is used).

In embodiments, the transient signal may be an asymmetric signal. It is an advantage of embodiments of the present invention that the test coverage is increased by using an asymmetric transient signal.

In embodiments, the transient signal may be a symmetric signal. It is an advantage of embodiments of the present invention that a symmetric signal is easy to generate.

In embodiments, an average or integral of the transient signal may be zero. It is an advantage of embodiments of the present invention that when the signal is acquired by an integration-based ADC (e.g. a sigma-delta ADC), the transient signal is averaged out, and the digitized signal is not affected by the test signal.

In embodiments, the transient signal may comprise a predetermined time-varying sequence, for example a pseudo random sequence. This embodiment provides the advantage of generating a transient signal that can be easily distinguished from the sensor signal, facilitating error detection and analysis.

In embodiments, the electronic control unit may comprise an interface configured for transmitting or receiving the synchronization pulse, wherein the processing module is configured for analyzing the processed signal in combination with the synchronization signal for determining one or more errors in the sensor device and/or for calibrating the sensor system. This embodiment provides the advantage of enabling the electronic control unit to perform error analysis based on the timing and characteristics of both the synchronization and transient signals.

In embodiments, the electronic control unit may be configured for transmitting the synchronization signal and the sensor device may be configured for receiving the synchronization pulse. In embodiments, the electronic control unit may be configured for receiving the synchronization signal and the sensor device may be configured for transmitting the synchronization signal. These alternative embodiments provide the flexibility of having either the sensor device or the electronic control unit initiate the synchronization process, which can be advantageous depending on the system design.

In a second aspect, the present invention relates to a method for measuring a physical parameter in safety critical applications, the method comprising: processing and transmitting a signal, obtained by a sensor device by measuring the physical parameter using a sensor, in a signal processing chain to obtain a processed signal at an output of the signal processing chain, receiving the processed signal by an electronic control unit, transmitting or receiving a synchronization signal using an interface of the sensor device and vice versa receiving or transmitting the synchronization signal using an interface of the electronic control unit, generating a transient signal and coupling the transient signal to the input of the signal processing chain to obtain a processed transient signal at the output of the signal processing chain, wherein the transient signal which is coupled to the signal processing chain has a predetermined time relation with the synchronization signal, detecting the processed transient signal by the electronic control unit, determining if an error is present and/or calibrating a delay between the synchronization signal and the detection moment of the processed transient signal by analyzing the processed transient signal, wherein an expected time difference between the synchronization signal and the detection moment of the processed transient signal is obtained and wherein a real time difference between the synchronization signal and the detection moment of the processed transient signal is measured.

In embodiments, determining if an error is present may be done by analyzing the processed transient signal in combination with the synchronization pulse. This embodiment provides the advantage of enabling the detection of errors by considering the relationship between the transient signal and the synchronization signal, which can improve the accuracy and reliability of the diagnostic process.

It is an advantage of embodiments of the present invention that the sensor device is capable of measuring a physical parameter and obtaining a signal indicative of the physical parameter with high precision and reliability, which is critical for safety applications. It is an advantage of embodiments of the present invention that the signal processing chain is configured for processing and transmitting the sensor signal efficiently, ensuring that the integrity of the data is maintained throughout the signal processing pathway. It is an advantage of embodiments of the present invention that the interface is configured for receiving or transmitting a synchronization signal external to the sensor device, allowing for precise timing and coordination with external systems or electronic control units. It is an advantage of embodiments of the present invention that the transient signal which is coupled to the signal processing chain has a predetermined time relation with the synchronization signal, which facilitates accurate diagnostics and error detection in the sensor device.

It is an advantage of embodiments of the present invention that the coupling element is configured for switching between the output of the sensor and an output of the transient signal generator, enabling a seamless transition between normal sensing operations and diagnostic testing. It is an advantage of embodiments of the present invention that the coupling element can sum the sensor signal and the transient signal without interrupting the normal operation of the sensor, which allows for continuous monitoring even during diagnostic procedures. It is an advantage of embodiments of the present invention that the coupling element can add the transient signal by biasing the sensing element in function of the transient signal, which can be used to test the sensor's response to changes in its operating conditions.

It is an advantage of embodiments of the present invention that the sensor system includes an electronic control unit with a signal acquisition module and a processing module configured for analyzing the processed signal and detecting characteristics of the transient signal for determining errors in the sensor device. This comprehensive analysis ensures that any potential issues are identified and addressed promptly, maintaining the system's overall safety and performance. It is an advantage of embodiments of the present invention that the electronic control unit's interface is configured for transmitting or receiving the synchronization pulse, which allows for a synchronized operation between the sensor device and the electronic control unit, enhancing the accuracy of error detection.

It is an advantage of embodiments of the present invention that the method for measuring a physical parameter in safety-critical applications includes steps that ensure the processed signal is transmitted and received accurately, and that the synchronization signal is used effectively to generate and detect a transient signal for error determination. This methodical approach to sensor operation and diagnostics ensures that the system remains reliable and effective in critical applications where safety is paramount.

In embodiments of the present invention the expected time difference between the synchronization signal and the transient signal at the ECU is dependent on the predetermined time relation and on the signal processing chain. The expected time difference may be compared with the real time difference between the synchronization signal and the transient signal at the ECU in order to determine correct operation of the sensor device.

Particular and preferred aspects of the invention are set out in the accompanying independent and dependent claims. Features from the dependent claims may be combined with features of the independent claims and with features of other dependent claims as appropriate and not merely as explicitly set out in the claims.

The above and other characteristics, features and advantages of the present invention will become apparent from the following detailed description, taken in conjunction with the accompanying drawings, which illustrate, by way of example, the principles of the invention. This description is given for the sake of example only, without limiting the scope of the invention. The reference figures quoted below refer to the attached drawings.

Figure 1:
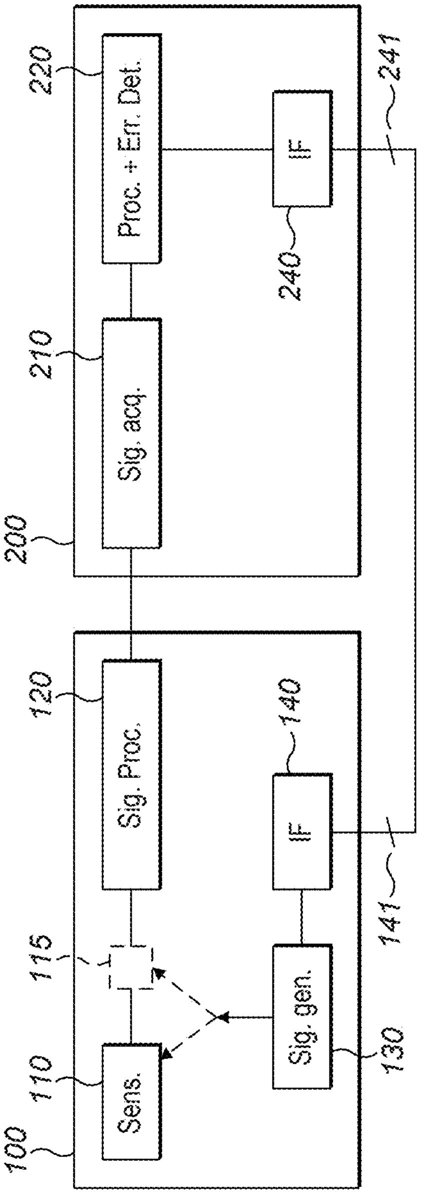
FIG. 1 is a block diagram of a sensor system comprising a sensor device and an electronic control unit according to embodiments of the present invention.

Any reference signs in the claims shall not be construed as limiting the scope. In the different drawings, the same reference signs refer to the same or analogous elements.

DETAILED DESCRIPTION OF ILLUSTRATIVE EMBODIMENTS

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the invention.

The terms first, second, third and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the invention described herein are capable of operation in other sequences than described or illustrated herein.

Moreover, the terms top and over and the like in the description and the claims are used for descriptive purposes and not necessarily for describing relative positions. It is to be understood that the terms so used are interchangeable under appropriate circumstances and that the embodiments of the invention described herein are capable of operation in other orientations than described or illustrated herein.

It is to be noticed that the term "comprising", also used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be interpreted as being limited to devices consisting only of components A and B. It means that with respect to the present invention, the only relevant components of the device are A and B. The term "comprising" therefore covers the situation where only the stated features are present and the situation where these features and one or more other features are present. The word "comprising" according to the invention therefore also includes as one embodiment that no further components are present. When the word "comprising" is used to describe an embodiment in this application, it is to be understood that an alternative version of the same embodiment, wherein the term "comprising" is replaced by "consisting of", is also encompassed within the scope of the present invention.

Similarly, it is to be noticed that the term "coupled" should not be interpreted as being restricted to direct connections only. The terms "coupled" and "connected", along with their derivatives, may be used. It should be understood that these terms are not intended as synonyms for each other. Thus, the scope of the expression "a device A coupled to a device B" should not be limited to devices or systems wherein an output of device A is directly connected to an input of device B. It means that there exists a path between an output of A and an input of B which may be a path including other devices or means. "Coupled" may mean that two or more elements are either in direct physical or electrical contact, or that two or more elements are not in direct contact with each other but yet still co-operate or interact with each other.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly, it should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

Furthermore, some of the embodiments are described herein as a method or combination of elements of a method that can be implemented by a processor of a computer system or by other means of carrying out the function. Thus, a processor with the necessary instructions for carrying out such a method or element of a method forms a means for carrying out the method or element of a method. Furthermore, an element described herein of an apparatus embodiment is an example of a means for carrying out the function performed by the element for the purpose of carrying out the invention.

In the description provided herein, numerous specific details are set forth. However, it is understood that embodiments of the invention may be practiced without these specific details. In other instances, well-known methods, structures and techniques have not been shown in detail in order not to obscure an understanding of this description.

The following terms are provided solely to aid in the understanding of the invention.

As used herein, and unless otherwise specified, the term "sensor device (100)" refers to an apparatus designed to detect, measure, and convert a physical parameter into a signal that can be processed. This includes any device that can measure physical properties such as temperature, pressure, magnetic fields, or motion, and convert these measurements into electrical signals for further processing.

As used herein, and unless otherwise specified, the term "sensor (110)" refers to a component or subsystem within the sensor device that directly interacts with the environment to measure a specific physical parameter and produces an electrical signal indicative of that parameter. This encompasses devices such as thermocouples for temperature, piezoelectric sensors for pressure, Hall effect sensors for magnetic fields, and accelerometers for motion.

As used herein, and unless otherwise specified, the term "signal processing chain (120)" refers to a series of electronic components and circuits within the sensor device that receive the raw signal from the sensor, perform necessary conditioning such as amplification, filtering, or analog-to-digital conversion, and prepare the signal for transmission. Examples include amplifiers, analog filters, ADCs, and microprocessors.

As used herein, and unless otherwise specified, the term "interface (140 for the sensing device, 240 for the electronic control unit)" refers to a hardware and/or software component within the sensor device that facilitates communication with external devices or systems. This includes components that can receive or transmit synchronization signals, such as wired or wireless communication ports, and protocols that enable synchronization with external clocks or signals. The physical connection of this interface, such as for example interface pins, are referenced by numbers 141 for the sensing device, 241 for the electronic control unit.

As used herein, and unless otherwise specified, the term "transient signal generator (130)" refers to a component within the sensor device that produces a temporary, time varying signal. Examples or transient signal generators include transistors, switches, digital-to-analog converters (DACs), or analog and digital circuits capable of generating time-varying signals. Examples of transient signals include pulses, spikes, transitions, time-varying signals or waveforms that are intentionally introduced for a limited duration.

As used herein, and unless otherwise specified, the term "coupling element (115)" refers to a device or circuit within the sensor device that enables the connection and transfer of the transient signal to the input of the signal processing chain. This includes switches, summing junctions, or biasing circuits that can selectively introduce the transient signal into the signal path of the sensor output.

As used herein, and unless otherwise specified, the term "magnetic sensor" refers to a type of sensor (110) that detects magnetic fields or changes in magnetic fields and converts this information into an electrical signal. Examples include Hall effect sensors, magnetoresistive sensors, and fluxgate sensors.

As used herein, and unless otherwise specified, the term "current conductor or a coil" refers to a physical structure within the sensor device that can carry electrical current or form an inductive loop, respectively, and is used to generate a magnetic field that can be superimposed on the field measured by the magnetic sensor. This includes wires, traces on a circuit board, or wound coils that can influence the magnetic environment of the sensor.

As used herein, and unless otherwise specified, the term "asymmetric signal" refers to a transient signal that has a non-identical shape or amplitude when observed over its duration or when compared to its mirror image about a central axis. This includes signals with different rise and fall times, or signals with a positive peak that differs in magnitude from a negative peak.

As used herein, and unless otherwise specified, the term "symmetric signal" refers to a transient signal that is identical in shape and amplitude when observed over its duration or when compared to its mirror image about a central axis. This includes signals like sine waves, square waves, or any waveform that exhibits symmetry.

As used herein, and unless otherwise specified, the term "average or integral of the transient signal is zero" refers to a characteristic of the transient signal where the sum or integral of its values over a complete cycle or specified duration equals zero, indicating no net positive or negative bias in the signal. This includes bipolar pulses or alternating sequences that balance out over time.

As used herein, and unless otherwise specified, the term "pseudo random sequence" refers to a series of signal values that appear random but are generated deterministically by an algorithm, and are used as part of the transient signal. This includes sequences generated by linear feedback shift registers or other pseudo-random number generators.

As used herein, and unless otherwise specified, the term "electronic control unit (200)" refers to a separate device or system that interfaces with the sensor device, capable of receiving signals, performing computations, and executing control functions. This includes automotive ECUs, industrial controllers, or any computing device that can process sensor data and perform error detection.

As used herein, and unless otherwise specified, the term "signal acquisition module (210)" refers to a component within the electronic control unit that is responsible for receiving and initially processing the signal from the sensor device. This includes analog-to-digital converters, input buffers, or any circuitry that prepares the incoming signal for further analysis by the processing module.

As used herein, and unless otherwise specified, the term "processing module (220)" refers to a component within the electronic control unit that analyzes the received signal, detects characteristics of the transient signal within the processed signal, and determines the presence of errors in the sensor device. This includes microprocessors, digital signal processors, or any computational hardware or software capable of signal analysis and error detection.

As used herein, and unless otherwise specified, the term "synchronization pulse" refers to a specific type of synchronization signal that is a brief, time-bound signal used to synchronize operations between the sensor device and the electronic control unit. This includes clock pulses, timing signals, or any discrete signal used to establish a timing reference for communication or signal processing.

The invention will now be described by a detailed description of several embodiments of the invention. It is clear that other embodiments of the invention can be configured according to the knowledge of persons skilled in the art without departing from the technical teaching of the invention, the invention being limited only by the terms of the appended claims.

The present invention relates to various aspects and embodiments of sensor devices (100), sensor systems, and methods (300) for measuring physical parameters in safety-critical applications. The invention is particularly concerned with ensuring the reliability and accuracy of sensor devices (100) used in such applications by providing means for testing and diagnosing potential errors in the sensor devices (100).

In a first aspect, the present invention provides a sensor system for safety-critical applications comprising at least one sensor device (100) and an electronic control unit (200). Exemplary embodiments of such sensor devices are shown in FIG. 1, FIG. 2, FIG. 3, FIG. 7, FIG. 8, FIG. 9, and FIG. 10. The sensor device (100) comprises a sensor (110) for measuring a physical parameter and obtaining a signal indicative of the physical parameter. A signal processing chain (120) is configured for processing and transmitting the sensor signal to obtain a processed signal at an output of the signal processing chain (120). An interface (140) is provided to communicate outside the sensor device (100), i.e., the synchronization signal is received or sent externally from the sensor device (100). The sensor device (100) is configured for receiving the synchronization signal and is triggered by the synchronization signal for generating and transmitting the transient signal. A transient signal generator (130) is configured for generating a transient signal. In embodiments of the present invention the transient signal may be generated in response to the synchronization signal. In embodiments of the present invention the transient signal is coupled to the input of the signal processing chain a predefined period, which is the predetermined time relation, after receiving or transmitting the synchronization signal. A coupling element (115) is configured for coupling the transient signal to the input of the signal processing chain (120) to obtain a processed transient signal at the output of the signal processing chain.

The electronic control unit (200) comprises:

- a signal acquisition module (210) for receiving the processed signal from the output of the signal processing chain (120),
- a processing module (220) configured for analyzing the processed signal and detecting the transient signal, which is present in the processed signal from the signal processing chain (120), for determining one or more errors in the sensor device (100), and/or for calibrating the sensor system,
  - wherein the electronic control unit (200) is configured for obtaining an expected time difference and for measuring a real time difference between the synchronization signal and the detection moment of the processed transient signal.

In embodiments of the present invention the synchronization signal may be received or transmitted by the electronic control unit (200), e.g. by the processing module (220). This may be done at a moment $t_1$. The processed transient signal may be detected by the processing module (220) at a detection moment $t_2$. The time difference between the synchronization signal and the detection moment of the processed transient signal is then equal to t2−t1.

In embodiments of the present invention the processing module is configured for analyzing the processed signal and detecting at least one characteristic of the processed transient signal. The detection moment $t_2$ may be the moment of detecting the at least one characteristic of the processed transient signal.

The time difference between the synchronization signal and the transient signal may be used for determining correct operation of the sensor device and/or the difference between the synchronization signal and the detection moment of the processed transient signal may be used for calibrating the sensor system.

In embodiments, an expected time difference can be used in combination with the measured time difference for error detection and/or calibration.

In embodiments of the present invention the expected time difference may be measured at start-up of the sensor-system or may be obtained through calculation. This expected time difference may be stored and may be later-on obtained by the electronic control unit.

In embodiments of the present invention the electronic control unit may be configured for comparing an expected time difference with a real time difference between the synchronization signal and the detection moment of the processed transient signal to determine correct operation of the sensor device.

In embodiments of the present invention the expected time difference and the real time difference between the synchronization signal and the detection moment of the processed transient signal may be used for calibrating the sensor system. The sensor system may for example be controlling a device such as a motor. In case there is a change in delay between the synchronization signal and the transient signal this may result in an incorrect control of the device. This may be resolved by calibration giving the fact that the real time difference is measured and taken in consideration.

Figure 7:
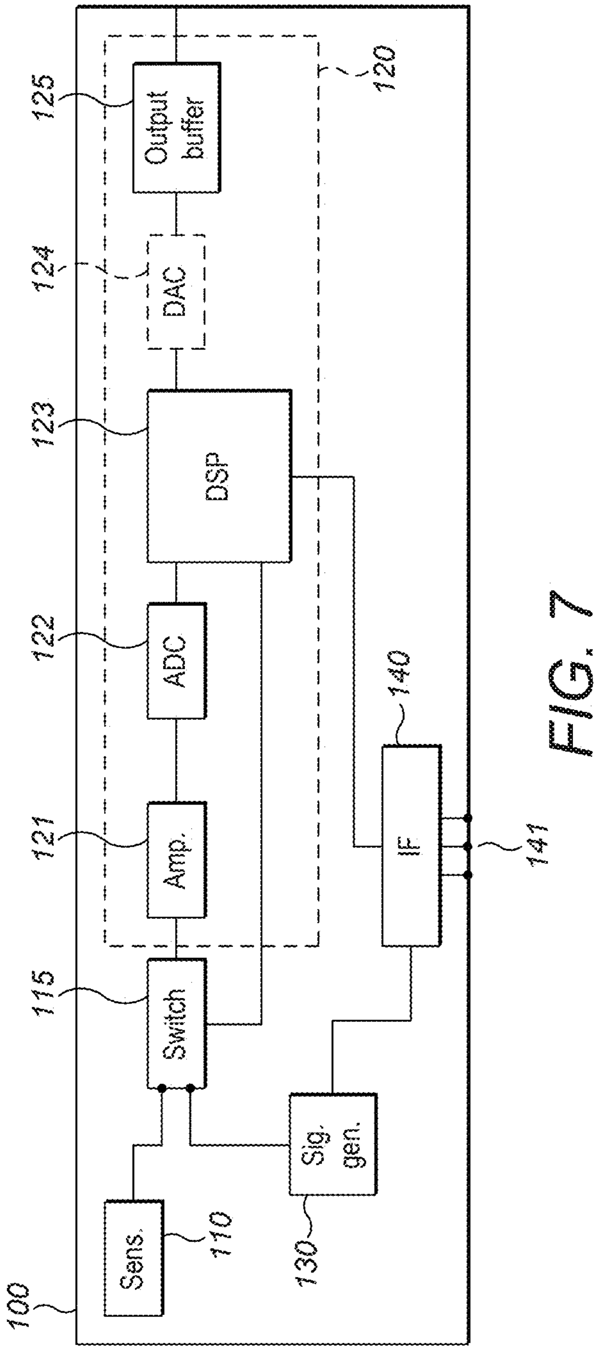
FIG. 7 is a schematic diagram illustrating the disconnection of the sensing element and the feeding of the transient signal at the input of the signal processing chain according to embodiments of the present invention.
Figure 8:
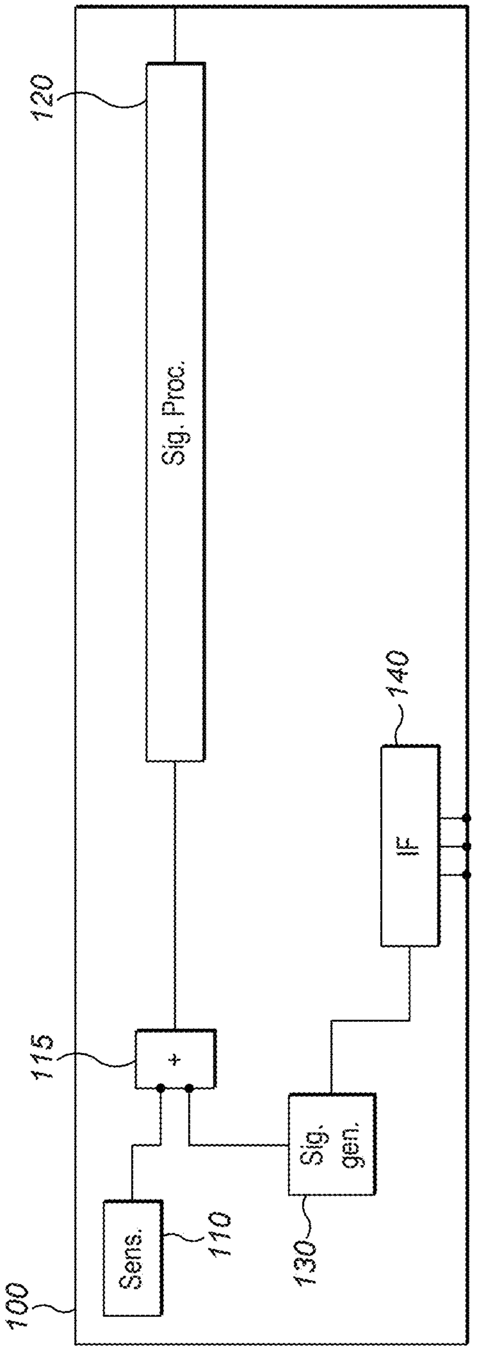
FIG. 8 is a schematic diagram showing the addition of a time-varying signal to the sensing signal according to embodiments of the present invention.
Figure 9:
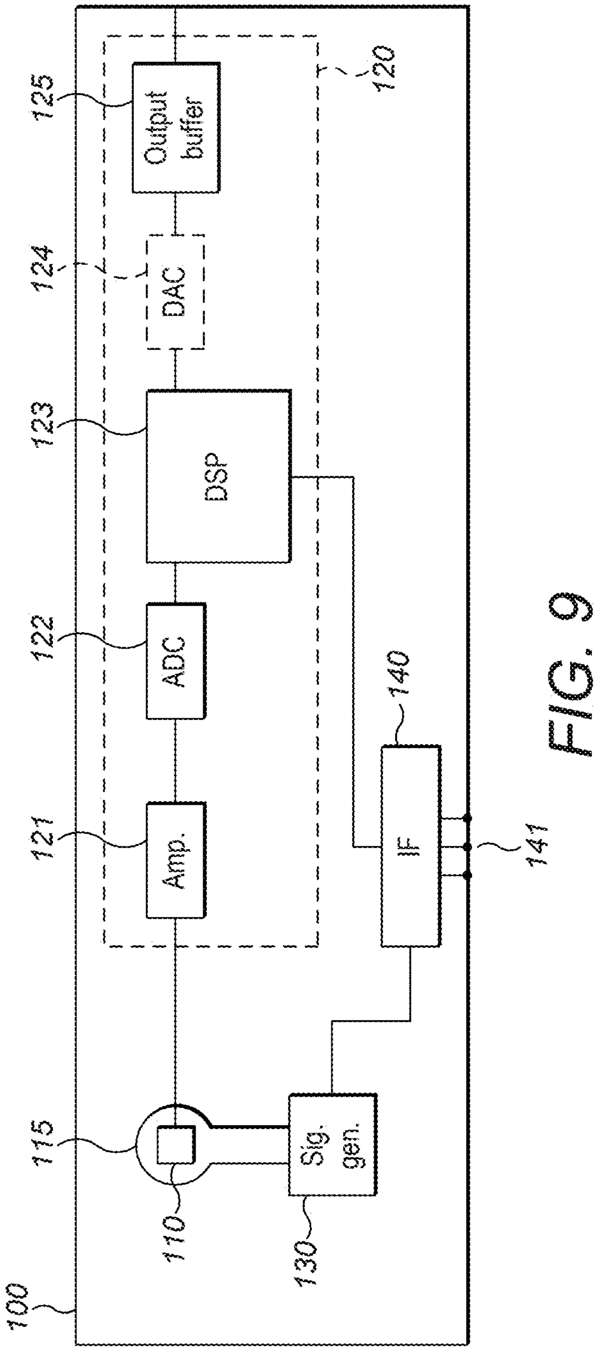
FIG. 9 is a schematic diagram depicting the addition of a time-varying signal to the sensing signal via a coil according to embodiments of the present invention.

The coupling element (115) may be configured in various ways to facilitate testing of the signal processing chain (120). For instance, it may switch between the output of the sensor (110) and an output of the transient signal generator (130) (FIG. 7). Alternatively, it may sum the sensor signal and the transient signal (FIG. 8). Alternatively, it may add the transient signal by biasing the sensing element in function of the transient signal (FIG. 10), or modulate the physical parameter by superposing a signal derived from the transient signal (FIG. 9). These configurations enable selective testing, concurrent operation, and assessment of the sensor's (110) behavior under simulated variations of the physical parameter. In embodiments of the present invention no switching coupling element is required, which simplifies the design and reduces potential points of failure.

The sensor (110) may be a magnetic sensor, and the coupling element (115) may be a current conductor or a coil arranged for generating a superposition magnetic field at the location of the sensor (110), as depicted in FIG. 9, which shows the addition of a transient signal to the sensing signal via a coil.

The transient signal can be a variety of signals, varying between at least two levels, with a least one transition. It can be: a rising edge, a falling edge, a pulse, a plurality of pulses, a pseudo-random sequence of pulses, a sine, a triangle, a plurality of various shapes, etc. The transient test signal can have a single polarity with respect to the sensor output, or multiple polarities. For example, in the embodiments where the test signal is added to the sensing signal (e.g. via a coil, or bias current, or summing amplifier), the test signal can only make the sensing signal increase, or also decrease, or both. For example, the polarity of the current sent in the coil can be only positive, or only negative, or positive and negative. When the test signal has two polarities, the mean of the test signal can be zero. An advantage of a test signal having a zero mean is that the test signal is cancelled out when acquired by integration-based ADC at the ECU (e.g. sigma-delta ADC).

Figure 11:
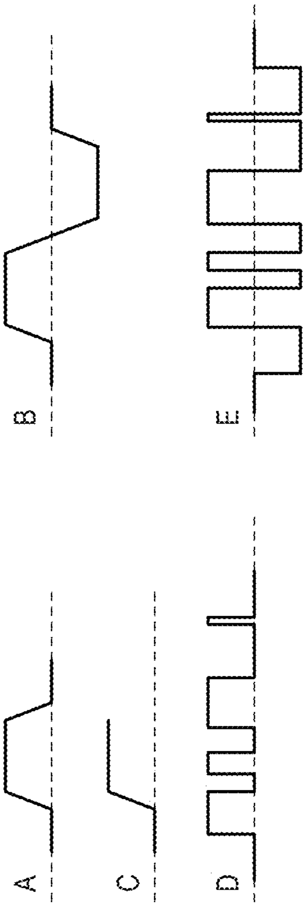
FIG. 11 is a schematic representation of various transient signals according to embodiments of the present invention.

The transient signal may be asymmetric or symmetric, and its average or integral may be zero, or it may comprise a pseudo-random sequence, as illustrated in FIG. 11, which presents various transient signals. In FIG. 11 a pulse signal (A), a rising edge signal (C), an asymmetric pulse train signal (D), a zero mean symmetric signal (B), and a zero mean asymmetric pulse train signal (E) are shown.

Figure 2:
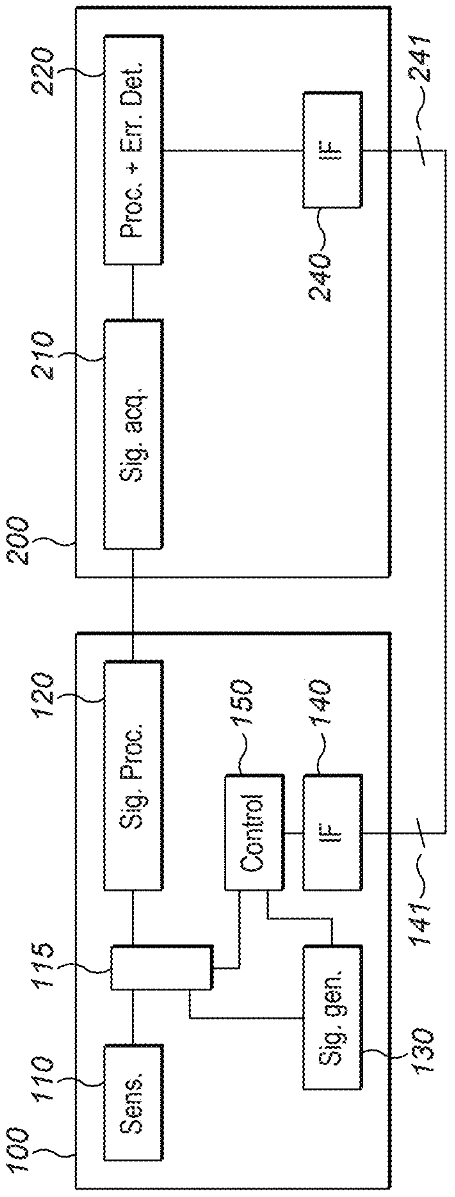
FIG. 2 is a block diagram of a sensor system comprising a sensor device with a controller for controlling the coupling element and an electronic control unit according to embodiments of the present invention.

Examples of a block diagram of a sensor system comprising a sensor device (100) and an electronic control unit (200) according to embodiments of the present invention are shown in FIG. 1, and FIG. 2. The electronic control unit (200) comprises a signal acquisition module (210) for receiving the processed signal from the output of the signal processing chain (120) and a processing module (220) configured for analyzing the processed signal. In embodiments of the present invention the processing module (220) detects at least one characteristic of the transient signal present in the processed signal to determine one or more errors in the sensor device (100) and/or for calibrating the sensor system. The electronic control unit (200) may also include an interface (240) for transmitting or receiving the synchronization pulse, as shown in FIG. 1, and FIG. 2. In FIG. 2 the sensor device (100) includes a controller (150) for controlling the coupling element (115) and the signal generator (130). The controller (150) gets its input from the interface (140). Upon receipt of a synchronization signal it may for example trigger the signal generator for generating a transient signal. If the coupling element (115) is a switch, the controller (150) may trigger the switch to connect the signal generator to the input of the signal processing chain (120) upon receipt of a synchronization signal, and to connect the sensor (110) to the input of the signal processing chain (120) after transmission of the transient signal. The transmitted synchronization signal and the transmitter transient signal may be received by an electronic control unit (200), and it is possible to determine a response time error from the time delay at the electronic control unit (200) between the synchronization signal and the transient signal. In embodiments of the present invention the sensitivity error can be computed from the drift of the slope of the transient signal, and the offset error can be calculated from the transient signal.

Figure 14:
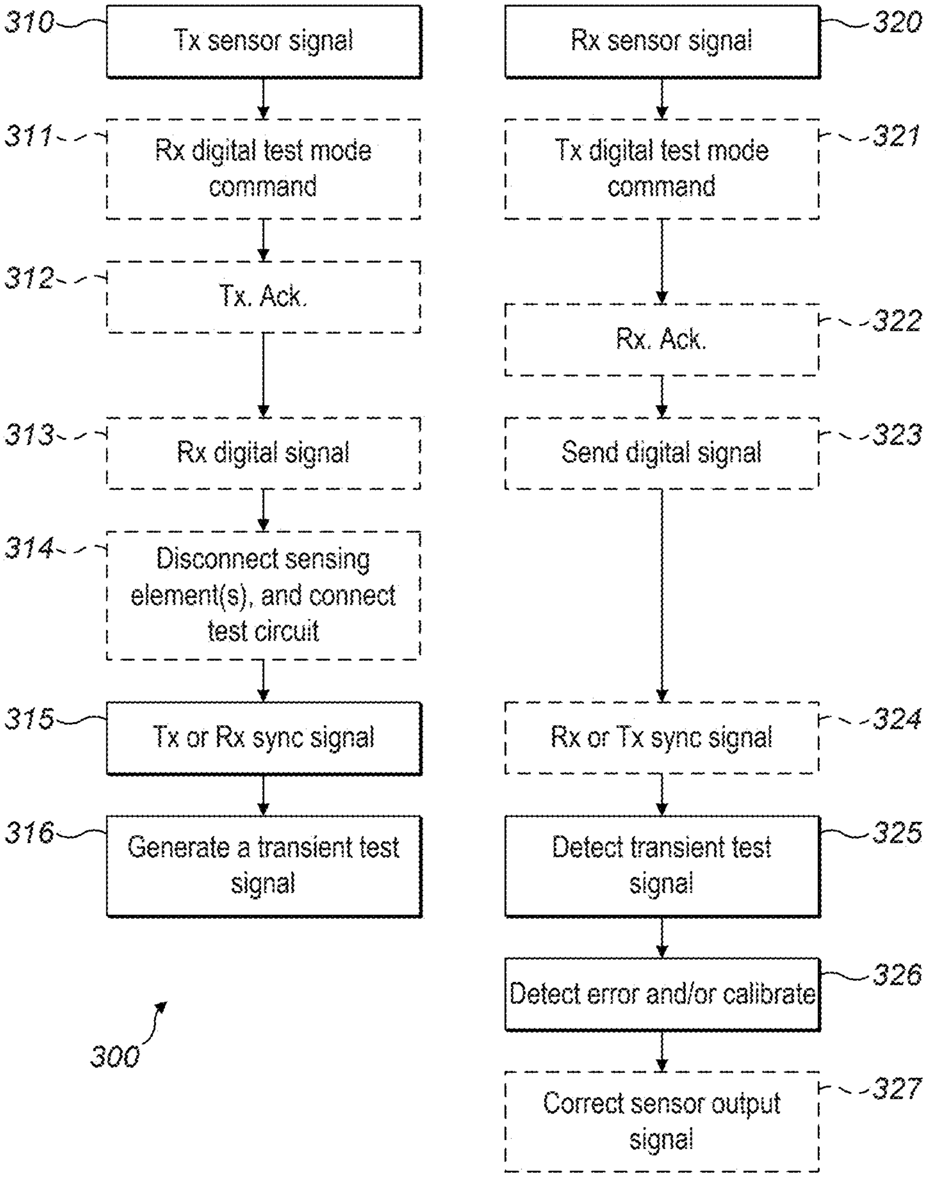
FIG. 14 is a flow chart of an exemplary method showing the steps at the sensor device and the electronic control unit (ECU) according to embodiments of the present invention.

In a second aspect, the invention provides a method (300) for measuring a physical parameter in safety-critical applications. A flow chart of an exemplary method in accordance with embodiments of the present invention is shown in FIG. 14. The left flow chart shows the steps at the sensor device and the right flow chart shows the steps at the electronic control unit (ECU). The optional steps in this figure are outlined with dashed lines.

The method (300) involves processing and transmitting (310) a signal, obtained by a sensor device (100), in a signal processing chain (120) to obtain a processed signal at an output of the signal processing chain (120), receiving (320) the processed signal by an electronic control unit (200). At the sensor device side a sensor signal is transmitted (310). This may be done continuously. For doing so a signal from sensing element is acquired and a signal indicative of physical quantity is transmitted. At the ECU the sensor signal is received (320).

A digital test mode command may optionally be transmitted (321) by the ECU to the sensor device via a digital bus. This may be done via the interface 240 over the interface pins 241. The interface may for example be a digital serial protocol (e.g. SPI).

The digital test mode command may optionally be received (311) by the sensor device (100) to initiate diagnostic mode. This may be done via the interface (140) over the interface pins (141). The interface may for example be a digital serial protocol (e.g. SPI). The sensor device may acknowledge (312) receipt of the test mode command. This acknowledgement may be received (322) by the ECU (200).

The ECU may send (323) a digital signal which is received (313) at the sensor device. This digital signal may for example be a pulse. Upon receipt of this signal the sensing element(s) may be disconnected from the signal processing chain, and the transient signal generator may be connected to the signal processing chain (314).

In embodiments of the present invention a synchronization signal is transmitted or received (315) by the sensor device (100). It may for example be transmitted (324) by the electronic control unit and received (315) by the sensor device or transmitted (315) by the sensor device and received (324) by the electronic control unit. This may be done using the interface (140) of the sensor device and using the interface (240) of the ECU.

A predetermined time after receiving or transmitting the synchronization signal a transient signal is generated (316) by the sensor device and coupled to the input of the signal processing chain. The predetermined time may be the minimum time required for generating the transient signal or it may be a fixed time. The transient signal has a predetermined timing characteristic (e.g. a rising edge with a predetermined rise time).

At the ECU (200) the processed transient signal, which passed through the complete processing chain, is detected (325) by the ECU. The transient signal may be transmitted by the sensor device together with the sensor signal, in which case the ECU should separate the processed sensor signal and the processed transient signal. This may for example be achieved by filtering. Both signals may be in a different frequency range. The transient signal may be transmitted (316) by the sensor device during a different period than the sensor signal.

In embodiments of the present invention the method comprises determining (326) if an error is present and/or calibrating a delay between the synchronization signal and the detection moment of the processed transient signal by analyzing the processed transient signal, wherein an expected time difference between the synchronization signal and the detection moment of the processed transient signal is obtained and wherein a real time difference between the synchronization signal and the detection moment of the processed transient signal is measured.

In embodiments of the present invention the ECU is configured for detecting if there are any errors in the sensor device by analyzing the processed transient signal which passed through the complete processing chain based on the fact that the processed transient signal has a predetermined timing characteristic. The ECU may thereby take into account the transfer characteristic of the processing chain and possibly also of the sensor if the transient signal is detected by the sensor. The ECU may also take into account the elapsed time between the synchronization pulse and the reception of the processed transient signal. It may for example verify if this elapsed time is as can be expected in a correctly working sensor system.

The method may comprise correcting (327) the sensor output signal for example by removing the transient signal from the sensor output signal.

Figure 3:
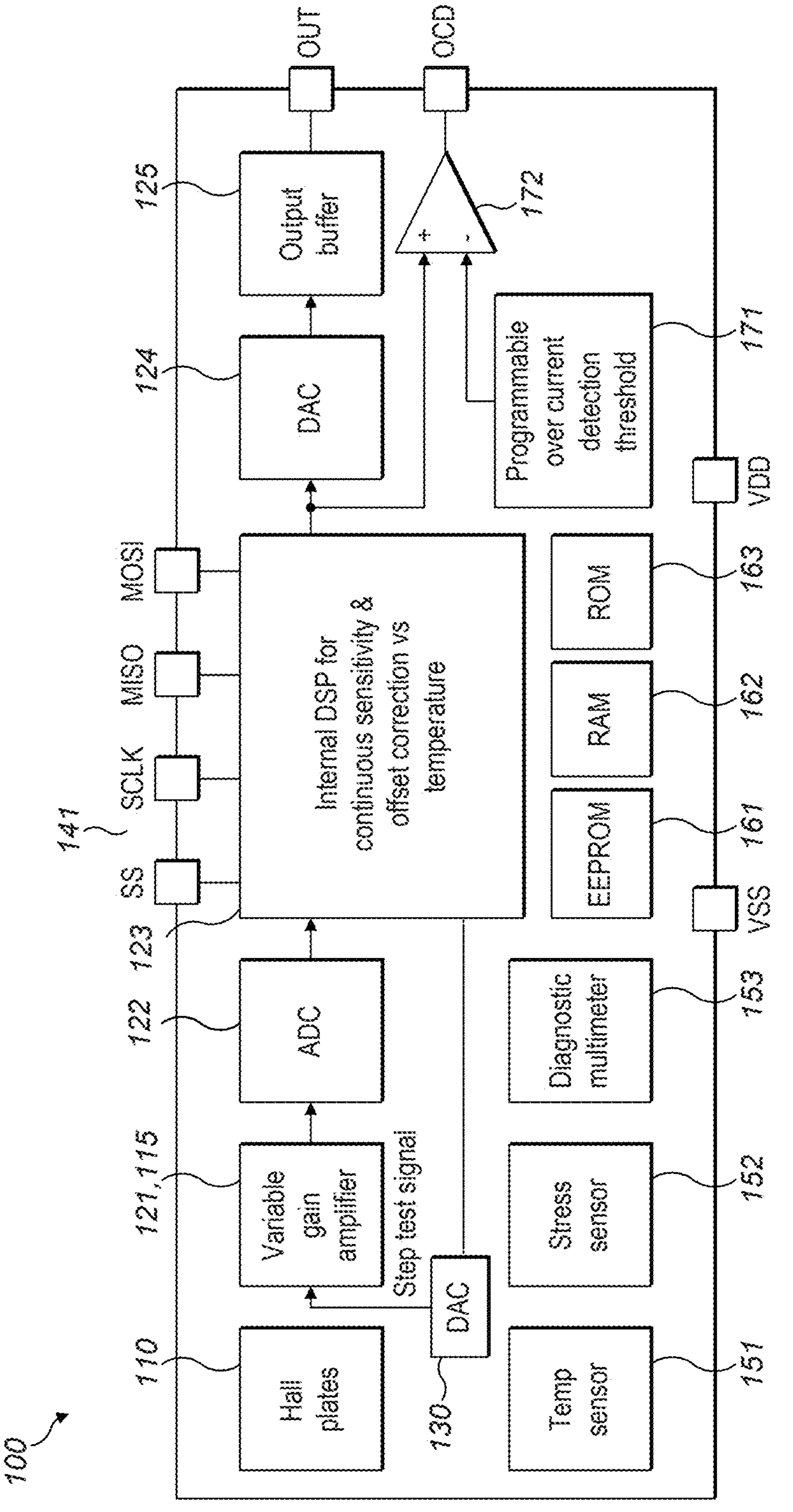
FIG. 3 is a schematic representation illustrating different building blocks of an exemplary sensor device according to embodiments of the present invention.

The invention also encompasses various embodiments that enhance the functionality and reliability of the sensor device (100) and system. For example, FIG. 3 illustrates different block diagrams of an exemplary sensor device according to embodiments of the present invention. In this example the sensor (110) is a Hall sensor. The signal processing chain comprises a variable gain amplifier (121) which is also the coupling element (115), an ADC (122), an internal DSP (123) for continuous sensitivity and offset correction versus temperature and providing the interface through interface pins (241), a DAC (124) and an output buffer (125). The illustrated sensor device (100), furthermore, comprises a transient signal generator (130). As depicted, the signal generator (130) may be a DAC. For example, the DAC can be controlled by a digital circuit to output a predetermined transient signal based on digital values stored in a memory. The sensor device (100), furthermore, comprises a stress sensor (152) and a diagnostic multimeter (153) of which the outputs are connected with the DSP (123). The DSP (123) has access to EEPROM (161), RAM (162) and ROM (163) for operating. The sensor device (100), furthermore, comprises a comparator (172) and a programmable overcurrent detection threshold (171) for generating an overcurrent detection signal if the over current detection threshold is exceeded.

Figure 4:
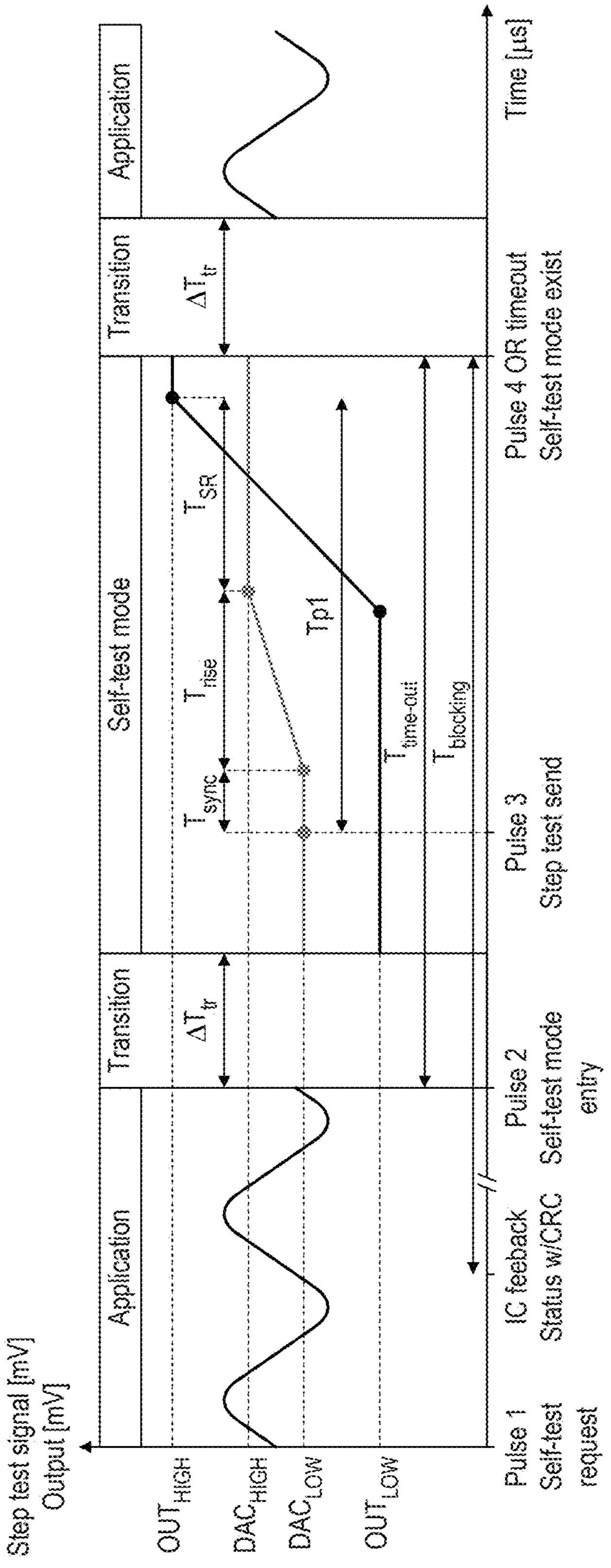
FIG. 4 is a sequence diagram of a method where the transient signal is a step response according to embodiments of the present invention.

FIG. 4 shows a sequence diagram where the transient signal is a step response. In this example a first pulse is (Pulse 1) is by the ECU to initiate self-test mode. Alternatively, the first pulse may be a digital command according to a digital communication protocol. After this pulse, the sensor device, which may be an integrated circuit, remains in application mode (which is illustrated by the sine wave output signal of the sensor device). After receiving the first pulse, the sensor device confirms it is ready to enter self-test mode by sending back an acknowledgement signal, for example a status bit or byte and a CRC. After receiving a second pulse (Pulse 2) the sensor device enters in self-test mode. During a transition period $\Delta T_{tr}$ the sensor prepares for switching from the sensor signal on the output to the transient signal on the output. At this stage the output of the transient signal generator 130 is set to a first predetermined value such as a low state ($DAC_{LOW}$) and the signal at the output is a first output value, for example a low state ($OUT_{LOW}$). After receiving a third pulse (this is the synchronization signal) the sensor device sends the transient signal. In this example the output of the transient signal generator starts increasing a period $T_{sync}$ after receiving the third pulse and the output of the transient signal rises during a period $T_{rise}$ up to a second predetermined value, such as a high level ($DAC_{HIGH}$). The period $T_{sync}$ is a resynchronization time and it may for example take +/−500 ns. The signal rise time $T_{rise}$ can for example be 1 μs. This figure also shows the transient signal at the output of the sensor device. During the self-test mode it changes from a first output level ($OUT_{LOW}$) to a second output level such as a high level ($OUT_{HIGH}$). The duration between the moment when the output of the transient signal generator becomes high and the moment when the output of the sensor device becomes high is referred to as $\tau_{SR}$. This duration is the transient response time of the sensor device and may for example be in the range of 1-10 μs. After receiving a fourth pulse or after a timeout the sensor device goes back to application mode. The duration between receiving the fourth pulse and entering application mode is referred to as $\Delta T_{tr}$. It may for example last about 1-10 μs. It is the time for which the output is not defined, during the transition from application mode to self-test mode and vice versa. It is understood that the cited numbers are only exemplary and that, e.g. depending on the application, different numbers are possible.

In this exemplary embodiment of the present invention two timers are implemented in the sensor device to switch the sensor device back to application mode if the sequence is not properly followed.

A first timer $T_{blocking}$ is a 10 ms timer (the invention is not limited to this timeout period) that kicks in after the first pulse, that guarantees that the sensor device will not remain in preparation of the self-test mode.

A second timer $T_{time\text{-}out}$ kicks in after receiving the test mode command (the second pulse). Depending on the test mode command it may for example range between 50 μs and 200 μs. This timer guarantees that the sensor device will not remain in self-test mode.

This means that, in this exemplary embodiment of the present invention, the synchronization signal has to be sent soon enough so that the sensor device can send and output the transient signal considering the delays explained above. When this second timer is implemented in this exemplary embodiment of the present invention it is not mandatory to send the fourth pulse to exit the self-test mode. It may, however, be advantageous to do so because sending the fourth pulse allows switching the sensor device (e.g. IC) back to application mode much sooner.

In embodiments of the present invention a response time error may be computed by storing the delay from the second pulse to when the sensor device output reaches 90% of the transient signal response.

In embodiments of the present invention the sensitivity error may be computed by computing the drift of the slope from the low level to the high level. The accuracy of these computations may for example be +/−5%.

In embodiments of the present invention the offset error may be computed with an accuracy of +/−1 mV by either:

- having a 0 as the low output level of the transient signal generator and computing the drift of the output at the low level;
- having symmetric values for the low and high transient signal generator levels and computing the drift of the average.

The period Tp1 is the propagation delay between receiving the synchronization signal (which in this case is a pulse i.e. the third pulse) and the sensor output reaching a predetermined value ($OUT_{HIGH}$).

Figure 5:
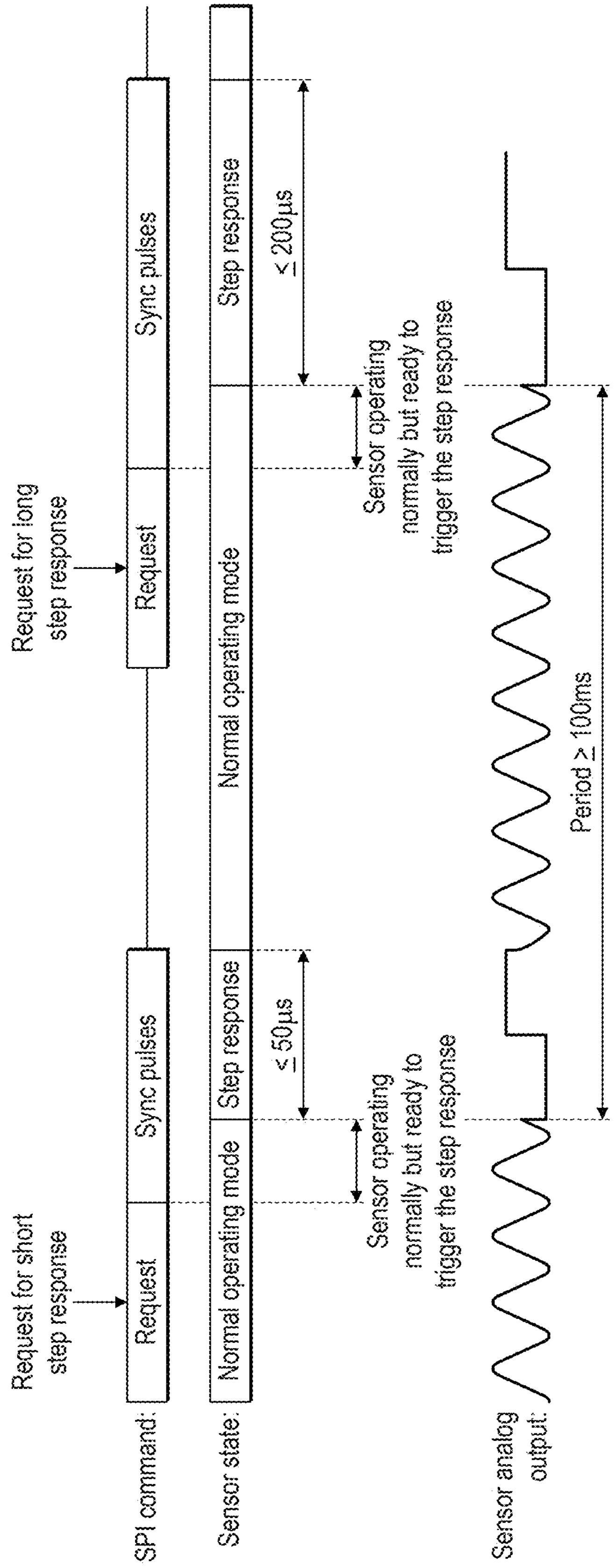
FIG. 5 is a timing diagram illustrating the relationship between commands, sensor state, and analog output of the sensor device according to embodiments of the present invention.
Figure 6:
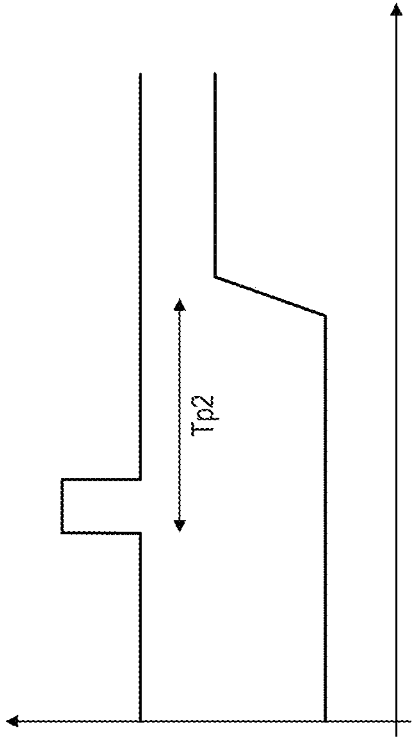
FIG. 6 is a timing diagram showing the synchronization signal at the electronic control unit and the step response at the electronic control unit according to embodiments of the present invention.

FIG. 5 provides a timing diagram illustrating the relationship between commands, sensor state, and analog output of the sensor device (100), while FIG. 6 shows the synchronization signal (at the top) at the electronic control unit (200) and the step response (at the bottom) at the electronic control unit (200) in function of time. The period Tp2 is the propagation delay Tp1 plus the propagation delay in the ECU which may for example be caused by the analog to digital conversion in the ECU. In embodiments of the present invention the period Tp2 may be measured (e.g. using a timer) and compared by the ECU with an expected value and an error may be indicated if the different between the measure period and the expected value exceeds a predefined threshold. This allows to test the whole timing of the processing chain (sensor device+ECU).

It is an advantage of embodiments of the present invention that the timing of the complete signal chain can be tested.

It is an advantage of embodiments of the present invention that the transient signal is controlled by the synchronization signal. This allows precise control of the transient signal. It is, moreover, advantageous that if normal operation is interrupted, the duration of the interruption is limited. It is, moreover, advantageous that the propagation delay can be tested accurately.

In embodiments of the present invention the signal from the sensor is disabled for a very short time (e.g. 10 μs to 200 μs) and a transient signal of fixed duration and amplitude is transmitted through the entire signal chain after the sensor. During that time the over current detection feature (OCD, see FIG. 3) may be disabled. The objective is to ensure that the sensor can accurately detect and diagnose errors in its signal processing chain, such as response time error, offset error, and sensitivity error. The sensor system may for example be able to detect response time errors greater than 350 ns, offset errors greater than 1 mV, and sensitivity errors greater than 5%.

In embodiments of the present invention a test mode command may be sent by an ECU (e.g. a controller) at any desired time over the interface of the sensor device. The test mode command may for example be a request for a short mode transient signal during which the application may be disabled for 50 μs or a long mode transient signal during which the application may be disabled for 200 μs.

FIG. 5 shows at the top commands which are received at the interface (140) of a sensor device (100) in accordance with embodiments of the present invention, in the middle the state of the sensor device and at the bottom the output signal of the sensor device.

The first request arriving at the sensor device (via the interface) is a request for a short transient signal. After receiving the request, the sensor device of this example is operating normally but is ready to transmit the transient signal when receiving the synchronization signal. The duration of the short transient signal is in this example less than 50 μs. The invention is not limited thereto. After transmitting the transient signal, the sensor device continues transmitting a signal indicative of the physical parameter. The second request arriving at the sensor device (via the interface) is a request for a long transient signal. When receiving the synchronization signal a transient signal with a duration of less than 200 μs is transmitted. The invention is not limited thereto.

FIG. 7 shows a lock diagram of a sensor device (100) in accordance with embodiments of the present invention. The sensor device (100) comprises a coupling (110) which in this embodiment is a switch which is configured for switching between the sensor (110) and the signal generator (130). The switch (115) is controlled by the DSP (123) of the signal processing chain (120). The DSP (123) therefore receives commands (e.g. the synchronization signal) from the interface (140). The signal processing chain (120) of this example comprises: an amplifier (121) and ADC (122), a DSP (123), a DAC (124) and an output buffer (125).

FIG. 8 shows an exemplary sensor device (100) in accordance with embodiments of the present invention. In this example the coupling element (115) is an adder which adds the transient signal and the sensing signal.

FIG. 9 shows a schematic diagram of an exemplary sensor device (100) in accordance with embodiments of the present invention. In this example the coupling element (115) is a coil which is present in the neighborhood of the sensor (110), which in this case is a magnetic sensor. The synchronization signal from the signal generator (130) will result in a magnetic field induced by a current through the coil which will be sensed by the sensor 130. An advantage of such an embodiment is that the functionality of the magnetic sensing element can be tested. Another advantage is that the sensor operation is not interrupted.

Figure 10:
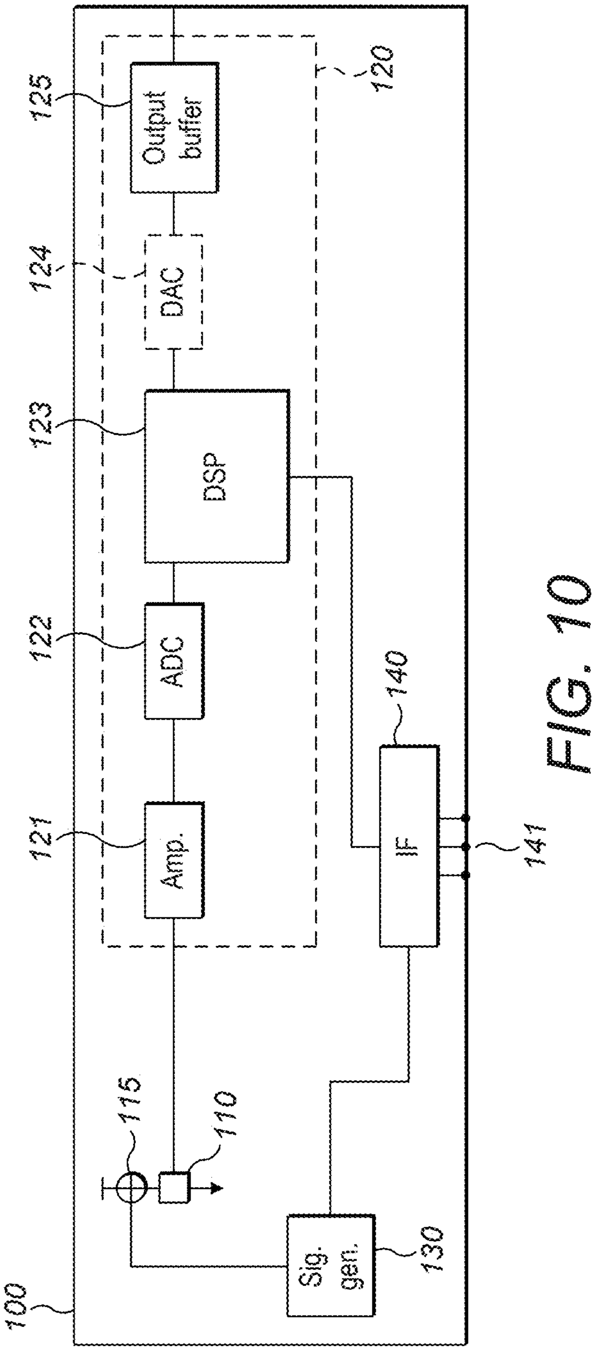
FIG. 10 is a schematic diagram illustrating the addition of a time-varying signal to the biasing current or voltage of the sensing element according to embodiments of the present invention.

FIG. 10 shows a schematic diagram of an exemplary sensor device (100) in accordance with embodiments of the present invention. In this example the coupling element (115) is an adder which is adding a transient signal to the biasing current or voltage of the sensing element. It has the effect of affecting the sensitivity of the sensing element in a predetermined manner, which can be detected by the ECU. The ECU can correct the sensitivity change and still access signal indicative of the physical parameter. The adder may be a node connection configured for adding a transient current (e.g. via a digitally-controllable current source) to the biasing current of the sensing element.

An advantage of adding the transient signal to the sensor signal is that the operation of the sensor is not interrupted. In these embodiments the ECU is configured for separating the sensor signal from the transient signal. This can for example be achieved by detecting an offset in the signal (see for example FIG. 13). As the offset is known, the ECU can remove it and access the actual data. Another advantage is that in balanced 3-phase systems an offset on the individual current signals is cancelled out when doing a Clarke transformation (e.g. moving from three phase voltages/currents to a voltage or current vector in a 2D vector space). This may for example be particularly useful in motor control.

Figure 12:
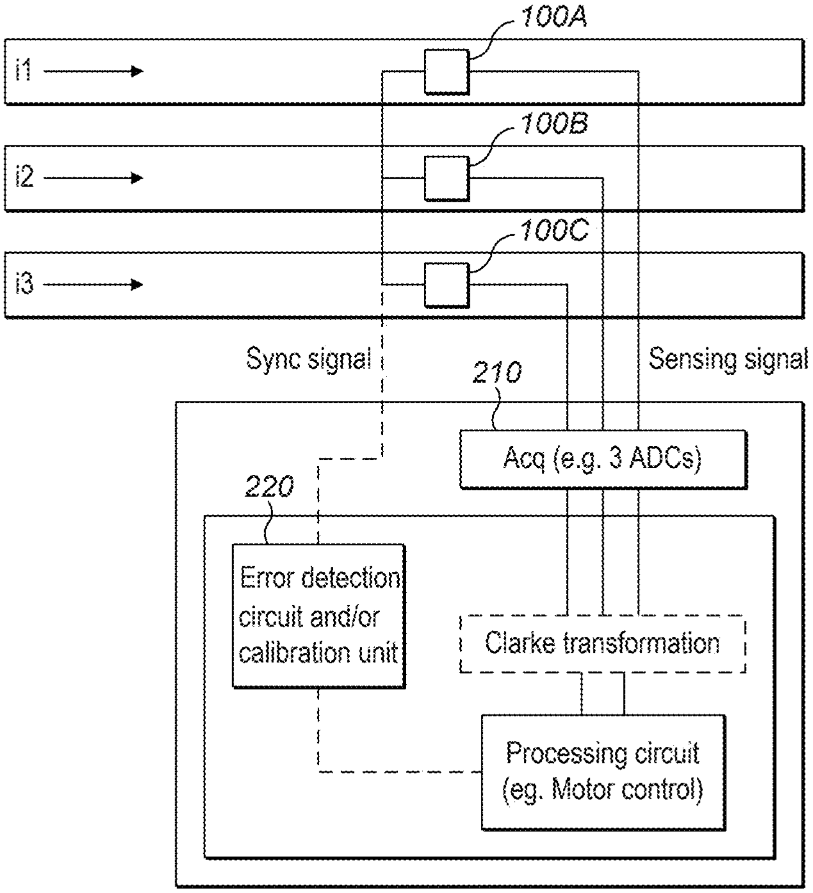
FIG. 12 is a block diagram of a 3-phase system with individual sensor error detection according to embodiments of the present invention.
Figure 13:
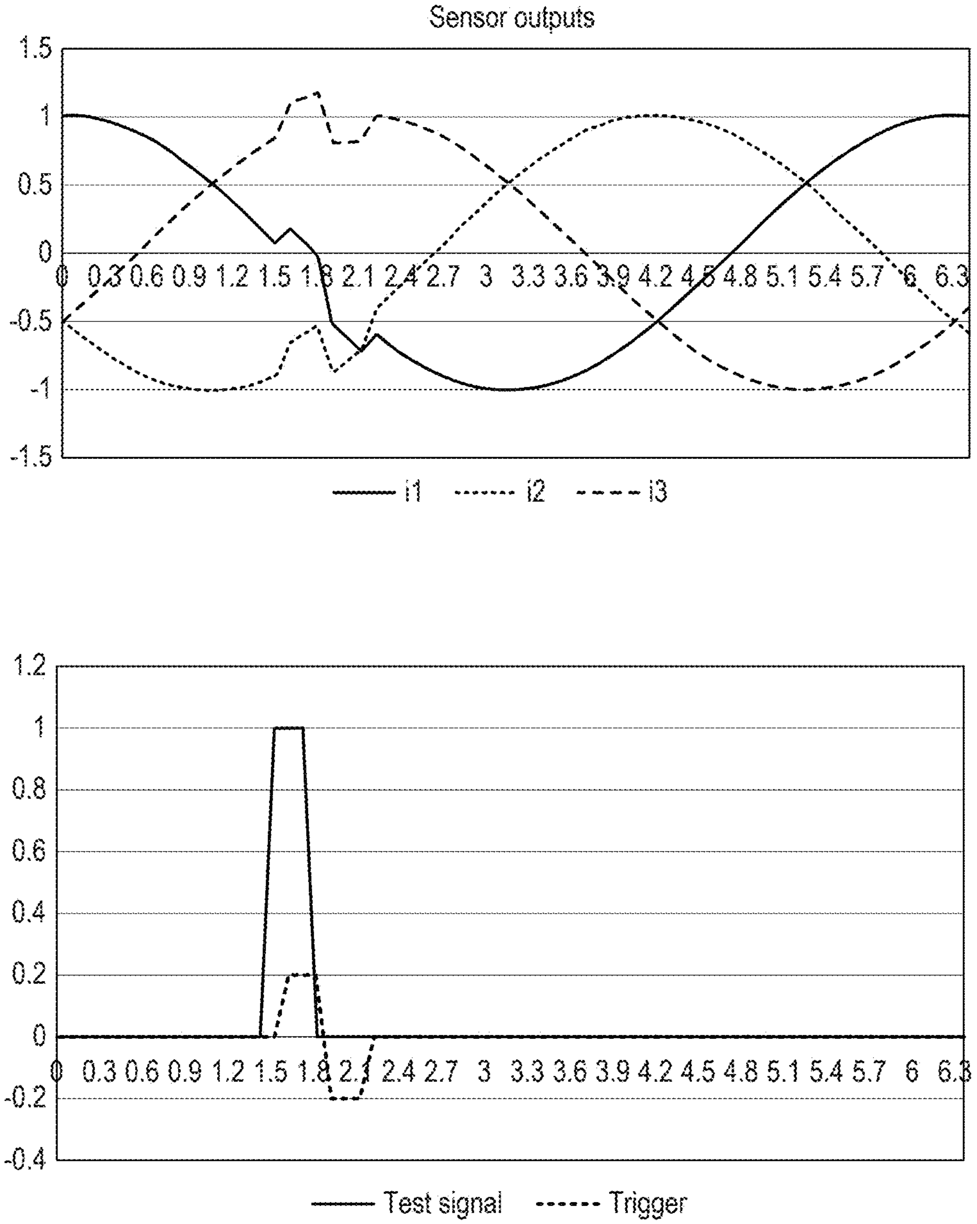
FIG. 13 is a timing diagram showing example signals in a 3-phase system for explanatory purposes according to embodiments of the present invention.

FIG. 12 and FIG. 13 focus on a 3-phase system with individual sensor error detection and example signals in a 3-phase system for explanatory purposes. FIG. 12 shows three sensing devices (100A, 100B, 100C). Their output signal is acquired by the signal acquisition module (210) of the ECU. A processing module (220) of the ECU is configured for analyzing the processed signals and detecting the transient signals, which are present in the processed signals from the signal processing chain (120), for determining one or more errors in the sensor devices (100). In this exemplary embodiment this is done by the error detection circuit. In embodiments of the present invention the processing module (220) may be configured for detecting at least one characteristic of the transient signals.

The individual sensor error detection may be based on signals upstream relative to the acquisition means (e.g. in case the acquisition means is an integration based amplified and the characteristic timing of the transient signal is faster than the integration bandwidth of the ADC).

After the Clarke transformation of the processed signals, the transient signals are removed and signals are obtained which can be used for motor control.

In sensor systems with more than one sensor device the trigger signal can be generated by the ECU, or by one of the sensors. In the latter case, the trigger signal can be sent to the ECU but this is not strictly required.

The top graph of FIG. 13 shows the three processed signals from the different phases. Each signal comprises a sine wave which is modified with the transient signal. This graph is for explanatory purposes only. The duration of the test signal relative to the sine wave periodicity may not be representative of reality.

The bottom graph of FIG. 13 shows the synchronization signal (the high pulse) and the transient signal for one phase (the signal with two polarities).

Overall, the invention ensures that sensor devices (100) used in safety-critical applications can be reliably tested and diagnosed for errors, thereby enhancing the safety and performance of the systems in which they are employed.

It is to be understood that although preferred embodiments, specific constructions and configurations, as well as materials, have been discussed herein for devices according to the present invention, various changes or modifications in form and detail may be made without departing from the scope of this invention. For example, any formulas given above are merely representative of procedures that may be used. Functionality may be added or deleted from the block diagrams and operations may be interchanged among functional blocks. Steps may be added or deleted to methods described within the scope of the present invention.

The invention claimed is:

1. A sensor system for safety critical applications comprising at least one sensor device and an electronic control unit, the sensor device comprising:

a sensor for measuring a physical parameter and obtaining a signal indicative of the physical parameter, a signal processing chain configured for processing and transmitting the sensor signal to obtain a processed signal at an output of the signal processing chain, an interface configured for receiving or transmitting a synchronization signal external to the sensor device, a transient signal generator configured for generating a transient signal and a coupling element configured for coupling the transient signal to the input of the signal processing chain to obtain a processed transient signal at the output of the signal processing chain, wherein the transient signal which is coupled to the signal processing chain has a predetermined time relation with the synchronization signal, the electronic control unit comprising:

a signal acquisition module for receiving the processed signal from the output of the signal processing chain, a processing module configured for analyzing the processed signal and detecting the processed transient signal, which is present in the processed signal from the signal processing chain, and for measuring a time difference between the synchronization signal and a detection moment of the processed transient signal and for determining one or more errors in the sensor device and/or for calibrating the sensor system based on said time difference.

2. The sensor system according to claim 1, wherein the coupling element of the at least one sensor device is configured for switching between the output of the sensor and an output of the transient signal generator.

3. The sensor system according to claim 1, wherein the coupling element of the at least one sensor device is configured for summing the sensor signal and the transient signal.

4. The sensor system according to claim 1, wherein the coupling element of the at least one sensor device is configured for adding the transient signal by biasing the sensing element in function of the transient signal.

5. The sensor system according to claim 1, wherein the coupling element of the at least one sensor device is configured for modulating the physical parameter by superposing a signal which is derived from the transient signal.

6. The sensor system according to claim 1, wherein the sensor of the at least one sensor device is a magnetic sensor.

7. The sensor system according to claim 1, wherein the sensor of the at least one sensor device is a magnetic sensor and wherein the coupling element of the at least one sensor device is a current conductor or a coil arranged for generating a superposition magnetic field at a location of the sensor.

8. The sensor system according to claim 1 wherein the transient signal of the at least one sensor device is an asymmetric signal.

9. The sensor system according to claim 1 wherein the transient signal of the at least one sensor device is a symmetric signal.

10. The sensor system according to claim 1 wherein an average or integral of the transient signal of the at least one sensor device is zero and/or wherein the transient signal comprises a pseudo random sequence.

11. The sensor system according to claim 1, the electronic control unit comprising an interface configured for transmitting or receiving the synchronization pulse, wherein the processing module is configured for analyzing the processed signal in combination with the synchronization signal for determining one or more errors in the sensor device and/or for calibrating the sensor system.

12. The sensor system according to claim 11, wherein the electronic control unit is configured for transmitting the synchronization signal and wherein the sensor device is configured for receiving the synchronization pulse, or wherein the electronic control unit is configured for receiving the synchronization signal and wherein the sensor device is configured for transmitting the synchronization signal.

13. A method for measuring a physical parameter in safety critical applications, the method comprising:

processing and transmitting a signal, obtained by a sensor device by measuring the physical parameter using a sensor, in a signal processing chain to obtain a processed signal at an output of the signal processing chain, receiving the processed signal by an electronic control unit, transmitting or receiving a synchronization signal using an interface of the sensor device and vice versa receiving or transmitting the synchronization signal using an interface of the electronic control unit, generating a transient signal and coupling the transient signal to the input of the signal processing chain to obtain a processed transient signal at the output of the signal processing chain, wherein that the transient signal which is coupled to the signal processing chain has a predetermined time relation with the synchronization signal, detecting the processed transient signal by the electronic control unit, determining if an error is present or calibrating a delay between the synchronization signal based on a time difference between the synchronization signal and the detection moment of the processed transient signal.

* * * * *